US005258327A

United States Patent [19]
Pao

[11] Patent Number: 5,258,327
[45] Date of Patent: Nov. 2, 1993

[54] MBE GROWTH METHOD FOR HIGH LEVEL DEVICES AND INTEGRATIONS

[75] Inventor: Yi-Ching Pao, San Jose, Calif.

[73] Assignee: Litton Systems, Inc., Beverly Hills, Calif.

[21] Appl. No.: 876,034

[22] Filed: Apr. 30, 1992

[51] Int. Cl.$^5$ .......................................... H01L 21/203
[52] U.S. Cl. .................... 437/107; 437/133; 437/237
[58] Field of Search ............... 437/105, 107, 133, 234, 437/967, 236, 237; 148/DIG. 5, DIG. 65, DIG. 119, DIG. 122, DIG. 138, DIG. 169

[56] References Cited

U.S. PATENT DOCUMENTS

| 4,075,651 | 2/1978 | James | 148/DIG. 119 |
|---|---|---|---|
| 4,939,102 | 7/1990 | Hamm et al. | 437/107 |
| 4,948,751 | 8/1990 | Okamoto et al. | 437/107 |
| 5,026,655 | 6/1991 | Ohata | 437/107 |

*Primary Examiner*—Brian E. Hearn
*Assistant Examiner*—C. Chaudhari
*Attorney, Agent, or Firm*—Elliott N. Kramsky

[57] ABSTRACT

A method for forming an epitaxial region on a semiconductor wafer substrate of III-V compound composition. After deposition of a dielectric mask, a seed layer that includes indium is evaporated over the wafer. A layer of III-V material is then deposited over the surface of the wafer by MBE growth. The seed layer acts to create uniformly distributed nucleation cites that are randomly spaced over the surface of the dielectric material and causes a reduction of the surface mobility of the atoms during the epitaxial growth process so that the residual polycrystalline material form atop the dielectric mark exhibits enhance surface morphology. As a result, the direct placement of interconnects on the polycrystalline material is achieve and the costly and time-consuming step of removing both the polycrystalline material and the dielectric mask of the prior art is avoided.

9 Claims, 1 Drawing Sheet

MBE GROWTH METHOD FOR HIGH LEVEL DEVICES AND INTEGRATIONS

BACKGROUND

1. Field of the Invention

The present invention relates to methods for use in fabricating higher-level semiconductor devices with molecular beam epitaxial (MBE) growth. More particularly, this invention pertains to such a method that provides processed wafers of enhanced surface morphology.

2. Description of the Prior Art

The fabrication of higher level integrated circuits involves the selective growth of distinct epitaxial layers on a common substrate. This is due to the fact that different band gap materials and device structures may be called for and distinct active epitaxial regions required when forming, for example, both an FET and a photodetector on a single wafer. It follows that the manufacture of higher level devices requires careful attention to the arrangement and growth of such multiple distinct regions that share extremely small common substrate bases. This is particularly apparent in the very high frequency device range (microwave, millimeter wave and optoelectronic) where high operating frequencies dictate extremely small sizes. Thus precise control of surface morphology, epitaxial layer size, definition and separation are critical.

Compounds of materials from the third (three valence electrons in outer shell) and fifth (five valence electrons in outer shell) columns of the periodic table are often employed as building blocks of high frequency devices. Such materials, known as "III-V compounds" are characterized by high electron mobilities (and, thus, very high frequency operation) and direct band gaps that make them appropriate for optoelectronic applications such as laser diodes and photodetectors. Indium, aluminum and Gallium are useful column III materials while antimony, phosphorous and arsenic are column V elements that are frequently composed and employed in electronically useful III-V compounds.

The fabrication of III-V compound-based higher level devices generally involves the formation of an initial active layer through MBE growth or ion implantation on the III-V compound substrate. The initial active layer is selectively masked by a dielectric layer and exposed portions thereof are then removed by means of a wet chemical etch. A second epitaxial layer is then grown upon the common wafer substrate by an MBE growth process. During this latter process, a residual polycrystalline layer composed of material of the laterformed epitaxial layer is deposited atop remaining portions of the dielectric mask.

The surface morphology of the residual polycrystalline material is generally rough, requiring its removal prior to formation of overlying interconnects. Furthermore, the roughness of such material limits the ability to produce very small feature sizes. Accordingly, selective MBE growth processes require removal of the residual layer of polycrystalline material, a difficult, time consuming and costly step.

SUMMARY OF THE INVENTION

The present invention addresses the foregoing and other shortcomings of the prior art by providing a method for forming at least one epitaxial region on a semiconductor wafer substrate comprising a single crystal III-V compound. Such method is begun by depositing a dielectric mask on the wafer. A seed layer that includes indium is then deposited over the dielectric mask and an epitaxial layer of III-V material is then grown over the wafer.

The foregoing and other features of this invention will become further apparent from the detailed description that follows. The written description is accompanied by a set of drawing figures. Numerals of the drawing figures, corresponding to those of the written description, point to the features of the invention. Like numerals refer to like features throughout both the written description and the drawing figures.

DETAILED DESCRIPTION

The selective epitaxial growth method of the present invention is illustrated in FIGS. 1 through 5 and the accompanying written description in a process for forming a plurality of epitaxial regions on a common semiconductor wafer substrate 10. The invention provides a significant improvement in such a process by eliminating difficult and costly steps required by the like prior art processes involving removal of residual polycrystalline material from the top of a dielectric mask. In the invention, the surface morphology of the residual layer is improved to such an extent that device interconnects may be formed directly thereover, thereby eliminating the costly material removal processes dictated by the relatively rough surface texture found to result in the prior art.

Figure 1:
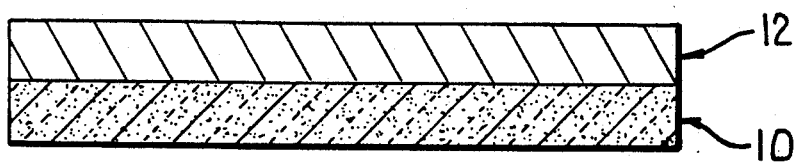
FIGS. 1 through 5 are a series of crosssectional views for illustrating the selective growth method of the invention.
Figure 2:
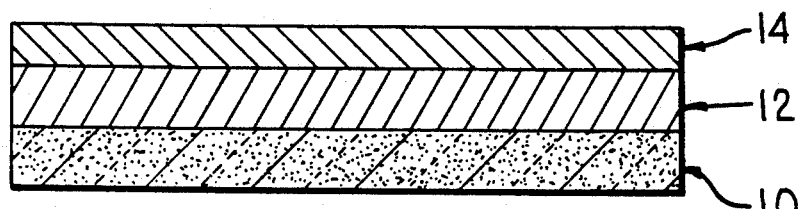

Referring first to FIG. 1, the process is begun by formation of a first or initial active layer 12 on a substrate 10 of a single crystal III-V compound such as GaAs or InP. The active layer 12 may be formed by one of a number of conventional processes including, for example, ion implantation, metal organic chemical vapor deposition ("MOCVD") or MBE growth. While the method of the invention is illustrated in application to the significant task of higher level device formation requiring the fabrication of multiple active epitaxial regions on a common substrate, it will be appreciated that the advantages of the invention may also be realized other processes such as the growth of a single active region on a III-V compound wafer. Additionally, the initial "active" layer 12 need not be doped. For example, the layer 12 might comprise an undoped heterostructure employed as a buffer layer.

Returning to the illustrated embodiment, the initial active layer 12 as formed has a predetermined epitaxial structure as required for use in a specified electronic or optoelectronic device. In the event that the wafer 10 should comprise single crystal GaAs, the layer 12 might comprise GaAs or a heterostructure of a ternary composition such as AlGaAs, InGaAs or InAlAs. Should an InP wafer 10 be employed, the layer 12 would properly comprise InGaAs or InAlAs. As mentioned earlier, the layer 12 is not essential to the method of the invention and, if utilized, may be either a doped or an undoped structure.

After formation of the layer 12, a dielectric layer 14 is deposited thereover. The dielectric layer 14 may comprise $SiO_2$ or $Si_3N_4$ and is preferably formed to between 100 and 10,000 Angstroms in thickness by a conventional process such as sputter deposition or plasma enhanced chemical vapor deposition ("PECVD").

Figure 3:
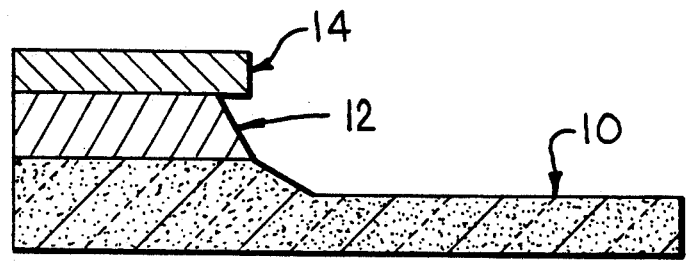

The dielectric layer 14 is etched to create a predetermined masking pattern. The mask is preferably formed by a reactive ion etching ("RIE") process to expose portions of the initial layer 12 for subsequent removal with a wet chemical etch. The structure resulting from the described steps and shown in FIG. 3 is recognized in the art as a mesa/trench formation.

Figure 4:
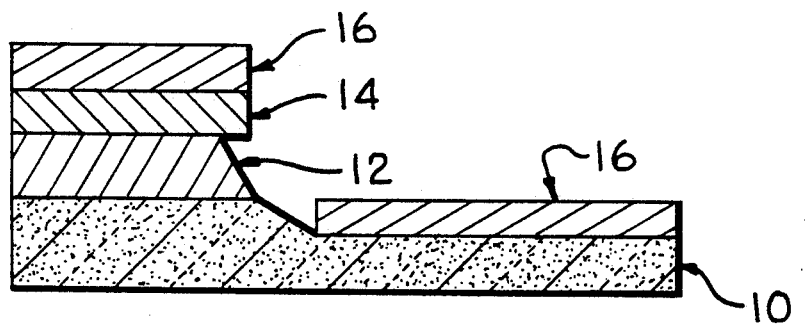

FIG. 4 illustrates the structure of the wafer after formation of a seed or interfacial layer 16. The layer 16 consist of a III-V composition that includes indium, such as InGaAs or InAlAs, and preferably has a thickness of between 20 and 2000 Angstroms. The Indium-based composition is grown in a temperature range between 300 and 500 degrees C. As it will be discussed below, the layer 16 interacts with the residue of a subsequent step to enhance the surface morphology and line definition of the residual polycrystalline material that will be formed over the dielectric mask 14.

Figure 5:
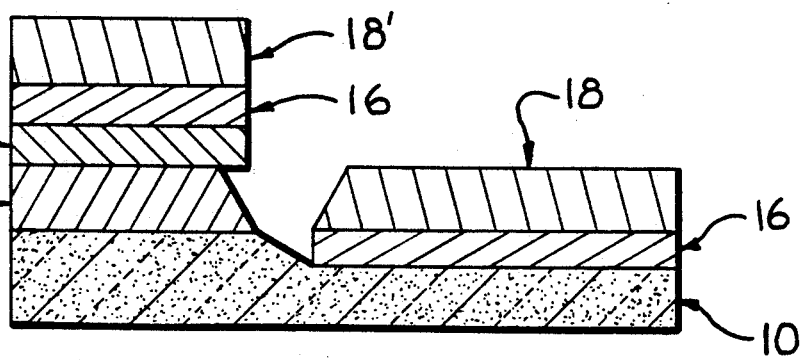

The completed selective growth process of the invention is shown in FIG. 5. As illustrated, a second epitaxial layer 18, for example GaAs, AlGaAs, InGaAs or InAlAs, is formed over the seed layer 16 to produce a second epitaxial layer 18 above the substrate 10. Residual polycrystalline material 18' of identical composition to the material of the layer 18 is deposited atop the dielectric mask 14 during the MBE growth. As mentioned earlier, the epitaxial layer 18 provides an active region of a second, predetermined band gap for a second device that will be formed upon the common wafer 10. Again, the method of the invention is not limited in application to the formation of higher level devices. Rather, this useful application has been employed to illustrate a particularly useful adaptation thereof.

The wafer as shown in FIG. 5 is now ready for subsequent processing to form a functioning semiconductor circuit. Essential steps such as ion implantation, photoresist patterning, Schottky barrier formation and the deposition of ohmic contact metals may now take place without intervening wafer processing (e.g. removal of residual material). As mentioned earlier, prior art processes require removal of the residual polycrystalline layer 18' along with the underlying mask 14 due to the surface roughness of the layer 18'. Such roughness did not permit the layer 18' to form a portion of the surface of the finished wafer in prior art processing. The additional steps required to remove the layer 18' involve time-consuming fabrication processes including remasking and etching. Furthermore, removal of the residual polycrystalline layer 18' exposes the underlying dielectric layer 14 whose removal may also then be necessitated in consideration of the type of device or circuit being formed. For example, the formation of transmission lines or other incompatible structures will require the removal of the undesirable oxide or nitride layer 14. Thus additional etching steps may follow those involving removal of the polycrystalline layer 18'. The time and effort consumed by such removal processes reduces yield and can significantly impact cost.

The inventor has found that, by employing a seed layer that contains indium, the resultant surface morphology of the residual polycrystalline material 18' is significantly enhanced. In practice, a reduction in the grain size of the polycrystalline material from the range of 0.5 to a few microns to less than 0.1 micron has been achieved. The resultant surface structure is enhanced to such a degree that direct placement of surface interconnections atop the material 18' is now possible. As a result, time-consuming and costly additional processing steps required in the prior art are avoided. Further, as a result of the smaller grain size of the polycrystalline material, it is possible to pattern extremely small areas and to provide very small openings that could not be achieved with the relatively-large grain size of the polycrystalline material generated by the prior art process. This, of course, is a particularly helpful feature in the fabrication of very high frequency devices.

A brief explanation of the mechanism and physical forces that contribute to the advantages and operation of the invention follows. While this explanation is believe to be complete and correct, neither the operation nor the resulting advantages of the invention are dependent upon the correctness and/or completeness of the analysis.

The seed layer 16, preferably containing an indium content of five (5) percent or more is believed to "dominate" the overlying structures and act in general as a wetting agent to "smooth out" nucleation sites for further MBE layer growth. The resultant distribution of nucleation sites reduces the surface atom migration that is known to result in an observed tendency of the atoms deposited thereover to segregate. The indium is a somewhat "sticky" material (i.e. the indium atoms possess a relatively low surface migration rate) when evaporated directly upon a surface, resulting in random generation and stability of uniform surface nucleation sites.

The reduction in surface atom migration is significant. The attraction between Gallium atoms, for example, will cause them to seek low energy sites. As a result, large growth islands are formed when the layer 18' is deposited directly upon the dielectric layer 14. This results in large grain sizes for the polycrystalline material. The surface chemistry of the deposited indium, however, reduces the migration of deposited surface atoms as the indium dominates the overlying material to produce a highly desirable, relatively smooth morphology that reflects the reduced grain size.

Thus, it can be seen, that the present invention provides an improved method for selective growth of material in a III-V compound system. As a result, and as shown in the illustrated example, the method of the invention permits the formation of higher level devices without necessitating the costly and time-consuming removal of layers of residual polycrystalline material and underlying dielectric mask prior to further device processing. Higher yields permit economies of scale that are eventually reflected in lower unit costs of completed devices. Furthermore, the small grain size of the polycrystalline material permits the patterning of very small areas, an especially helpful feature in the manufacture of very high frequency devices.

While this invention has been described with reference to its presently preferred embodiment it is not limited thereto. Rather, this invention is limited only insofar as defined by the following set of patent claims and includes within its scope all equivalents thereof.

What is claimed:

1. A method for forming at least one epitaxial region of ternary III-V composition on a semiconductor wafer substrate comprising a single crystal III-VII compound comprising the steps of:

a) depositing a dielectric mask on said wafer; then b) depositing a seed layer comprising a ternary III-V composition including indium over said dielectric mask; and then c) growing an epitaxial layer of III-V material over said wafer.

2. A method as defined in claim 1 wherein said epitaxial layer is grown by an MBE growth process.

3. A method as defined in claim 2 wherein said seed layer comprises at least five percent indium.

4. A method as defined in claim 3 wherein the thickness of said seed layer is between 20 and 2000 Angstroms.

5. A method as defined in claim 4 further including the step of depositing an initial epitaxial layer of III-V material on said wafer prior to the step of depositing said dielectric mask.

6. A method as defined in claim 13 wherein the step of depositing said seed layer further includes the step of growing said layer by an MBE process.

7. A method as defined in claim 1 wherein said seed layer is InGaAs.

8. A method as defined in claim 1 wherein said seed layer is InAlAs.

9. A method for forming at least one epitaxial region on a semiconductor wafer substrate comprising a single crystal III-V compound comprising the steps of:

a) depositing an initial epitaxial layer of III-V material on said wafer; then b) depositing a dielectric mask; then c) depositing a 20 to 2000 Angstrom thick seed layer including at least five percent indium over said dielectric mask; and then d) growing an epitaxial layer of III-V material thereover.

* * * * *